(12) United States Patent
Mont et al.

(10) Patent No.: US 9,373,543 B1
(45) Date of Patent: Jun. 21, 2016

(54) FORMING INTERCONNECT FEATURES WITH REDUCED SIDEWALL TAPERING

(71) Applicants: GLOBALFOUNDRIES Inc., Grand Cayman (KY); International Business Machines Corporation, Armonk, NY (US)

(72) Inventors: Frank W. Mont, Troy, NY (US); Shariq Siddiqui, Albany, NY (US); Douglas M. Trickett, Altamont, NY (US); Brown Cornelius Peethala, Albany, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/876,023

(22) Filed: Oct. 6, 2015

(51) Int. Cl.
  *H01L 21/4763* (2006.01)
  *H01L 21/768* (2006.01)
  *H01L 21/311* (2006.01)

(52) U.S. Cl.
  CPC .... *H01L 21/76877* (2013.01); *H01L 21/31144* (2013.01); *H01L 21/7684* (2013.01); *H01L 21/7685* (2013.01); *H01L 21/76814* (2013.01); *H01L 21/76816* (2013.01)

(58) Field of Classification Search
  CPC .................................................. H01L 21/4763
  See application file for complete search history.

*Primary Examiner* — Marvin Payen
(74) *Attorney, Agent, or Firm* — Amerson Law Firm, PLLC

(57) ABSTRACT

A method includes forming a stack of materials including a first dielectric layer having a conductive feature positioned therein, and a second dielectric layer positioned above the first dielectric layer. An etch mask including a plurality of spaced apart mask elements is formed above the second dielectric layer. The mask elements define at least a first via opening exposing the second dielectric layer. A patterning layer is formed above the etch mask. A second via opening is formed in the patterning layer to expose the first via opening in the etch mask. The second dielectric layer is etched through the second via opening to define a third via opening in the second dielectric layer exposing the conductive feature. The patterning layer and the etch mask are removed. A conductive via contacting the conductive feature is formed in the third via opening.

20 Claims, 15 Drawing Sheets

FORMING INTERCONNECT FEATURES WITH REDUCED SIDEWALL TAPERING

BACKGROUND OF THE INVENTION

1. Field of the Invention

The disclosed subject matter relates generally to the fabrication of semiconductor devices and, more particularly, to forming interconnect features, such as vias or lines, with reduced sidewall tapering.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

Conventional dual damascene interconnect techniques typically result in lines and vias with significant levels of sidewall tapering (i.e., inward tapering in a direction from top to bottom). For example, the sidewall angles may be less than 85 degrees instead of an idealized 90 degrees. This sidewall tapering requires increased spacing between adjacent vias to provide adequate electrical separation, thereby reducing density.

The present application is directed to various methods for forming vias so as to eliminate or reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive vias. One illustrative method includes, among other things, forming a stack of materials including a first dielectric layer having a conductive feature positioned therein, and a second dielectric layer positioned above the first dielectric layer. An etch mask including a plurality of spaced apart mask elements is formed above the second dielectric layer. The mask elements define at least a first via opening exposing the second dielectric layer. A patterning layer is formed above the etch mask. A second via opening is formed in the patterning layer to expose the first via opening in the etch mask. The second dielectric layer is etched through the second via opening to define a third via opening in the second dielectric layer exposing the conductive feature. The patterning layer and the etch mask are removed. A conductive via contacting the conductive feature is formed in the third via opening.

Another illustrative method includes, among other things, forming a stack of materials comprising a first dielectric layer having a conductive feature positioned therein, a second dielectric layer positioned above the first dielectric layer, and a hard mask layer positioned above the second dielectric layer. An etch mask including a plurality of spaced apart mask elements is formed above the hard mask layer. The mask elements define at least a first via opening exposing a first portion of the hard mask layer and a first trench opening exposing a second portion of the hard mask layer. The hard mask layer is etched using the etch mask to define a second via opening and a second trench opening in the hard mask layer. A patterning layer is formed above the hard mask layer and the mask elements. A third via opening is formed in the patterning layer to expose the second via opening in the hard mask layer. The second dielectric layer is etched through the second via opening to define a fourth via opening in the second dielectric layer exposing the conductive feature. A sacrificial material is formed in the first, second, third and fourth via openings. The patterning layer is removed to expose the second trench opening. The second dielectric layer is etched through the second trench opening to define a trench recess in the second dielectric layer. The sacrificial material at least partially fills the fourth via opening during the etching of the second dielectric layer through the second trench opening. The mask elements, the hard mask layer and the sacrificial material are removed. A conductive via contacting the conductive feature is formed in the fourth via opening and a conductive line is formed in the trench recess.

BRIEF DESCRIPTION OF THE DRAWINGS

The disclosure may be understood by reference to the following description taken in conjunction with the accompanying drawings, in which like reference numerals identify like elements, and in which.

Figure 1A:
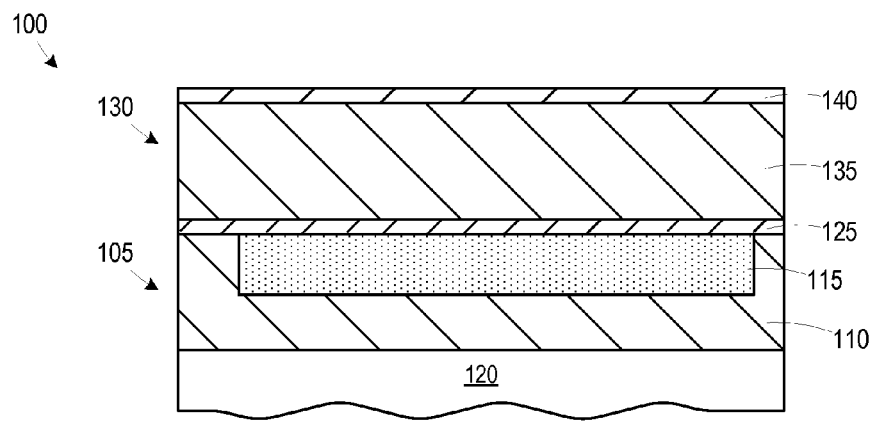
FIGS. 1A-1V are cross-sectional diagrams depicting illustrative techniques for forming interconnect features with reduced sidewall tapering as compared to prior art interconnect features.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming an interconnect structure. With reference to the attached drawings various illustrative embodiments of the methods and devices disclosed herein will now be described in more detail.

Figure 1B:
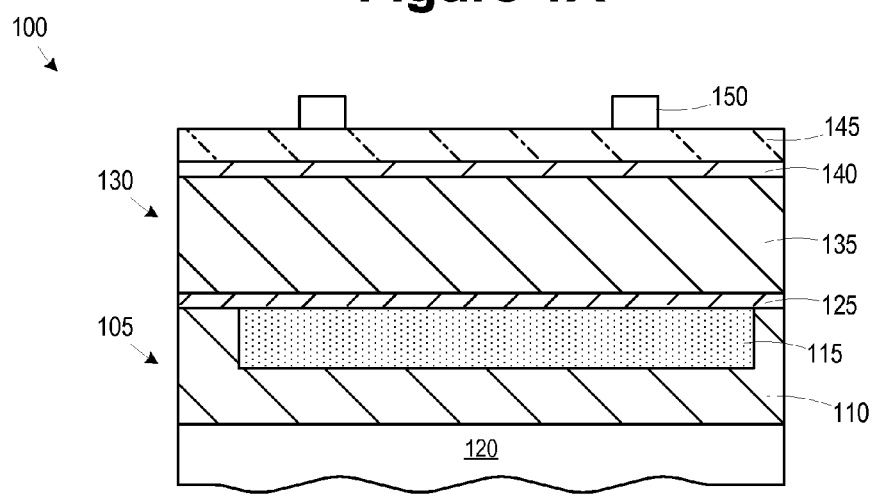
Figure 1C:
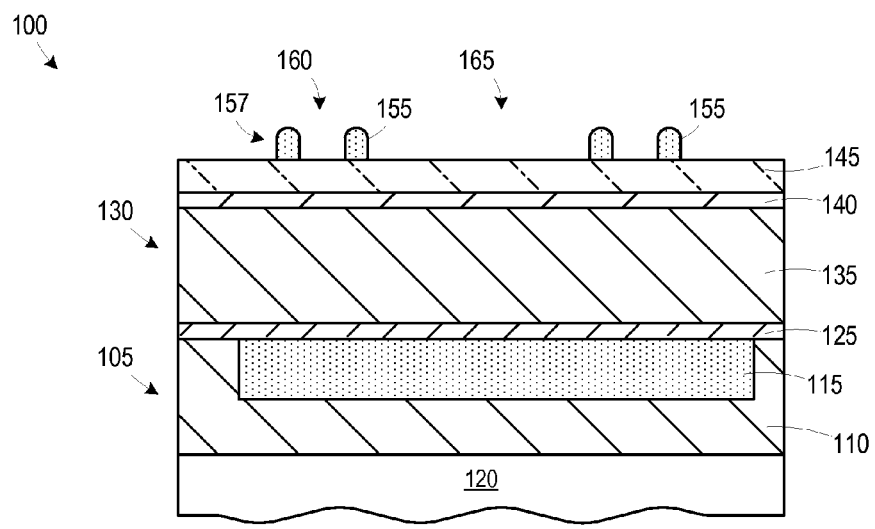
Figure 1D:
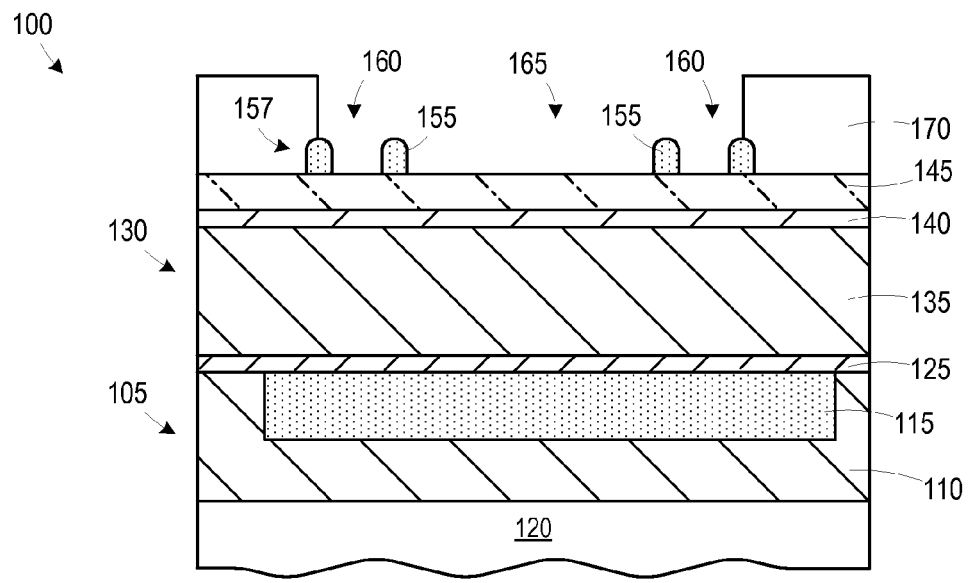
Figure 1E:
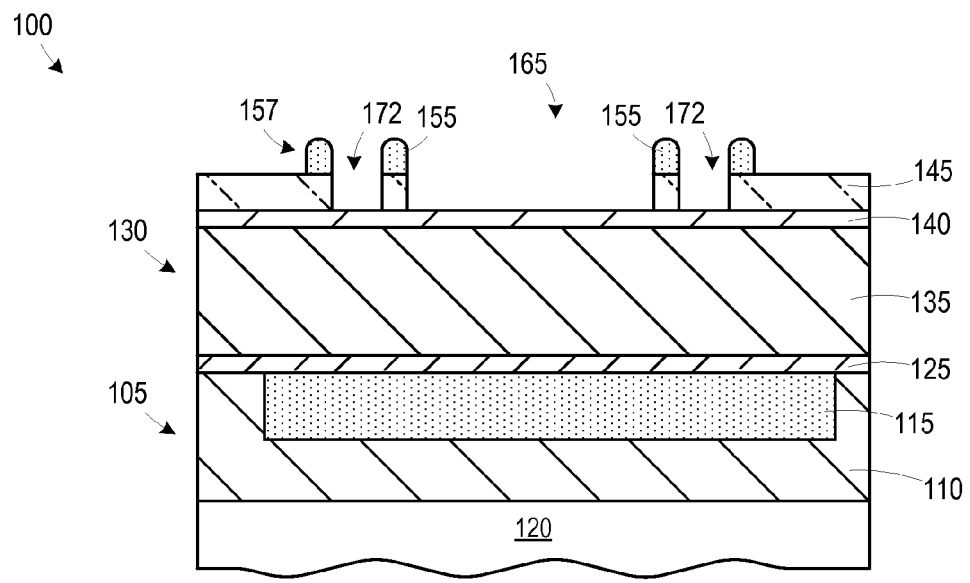
Figure 1F:
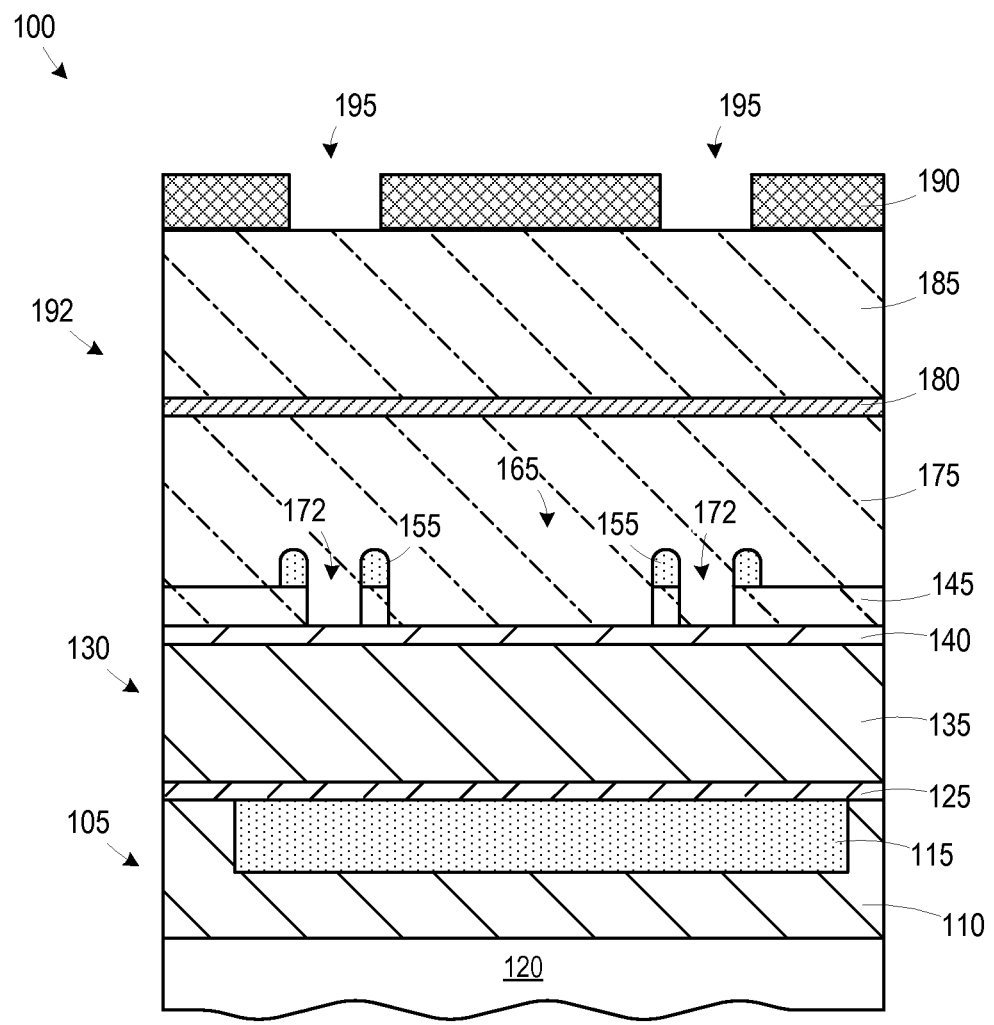
Figure 1G:
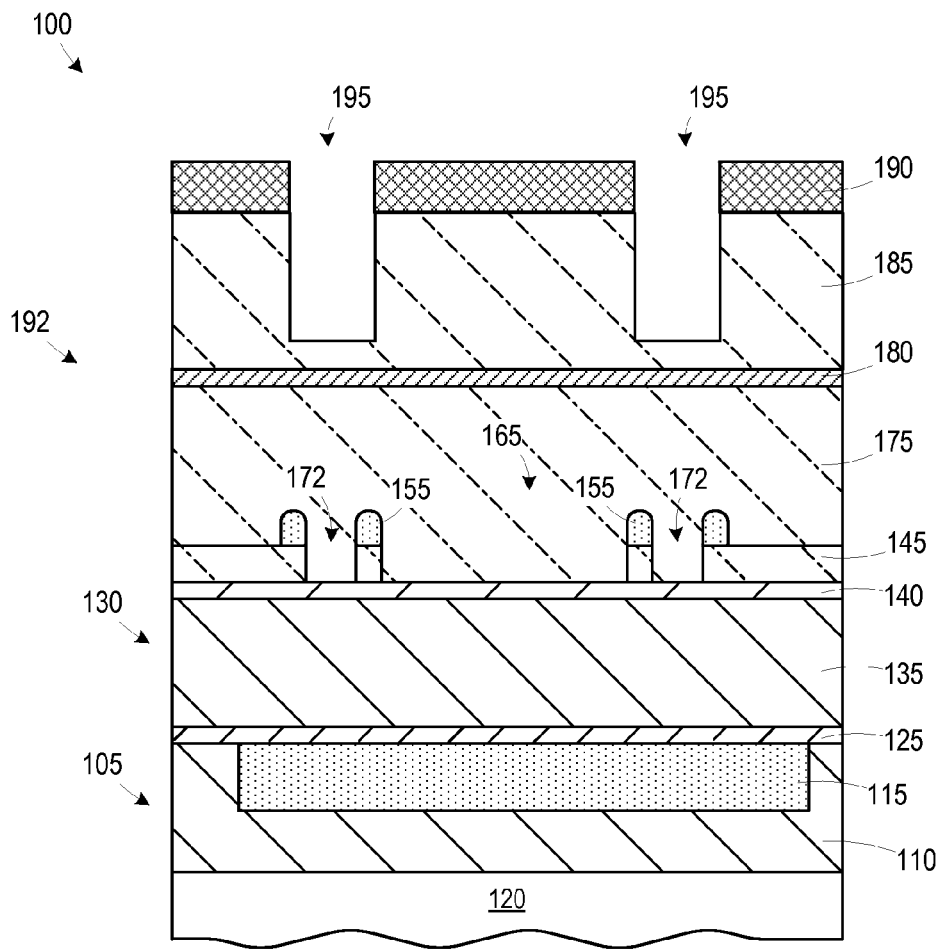
Figure 1H:
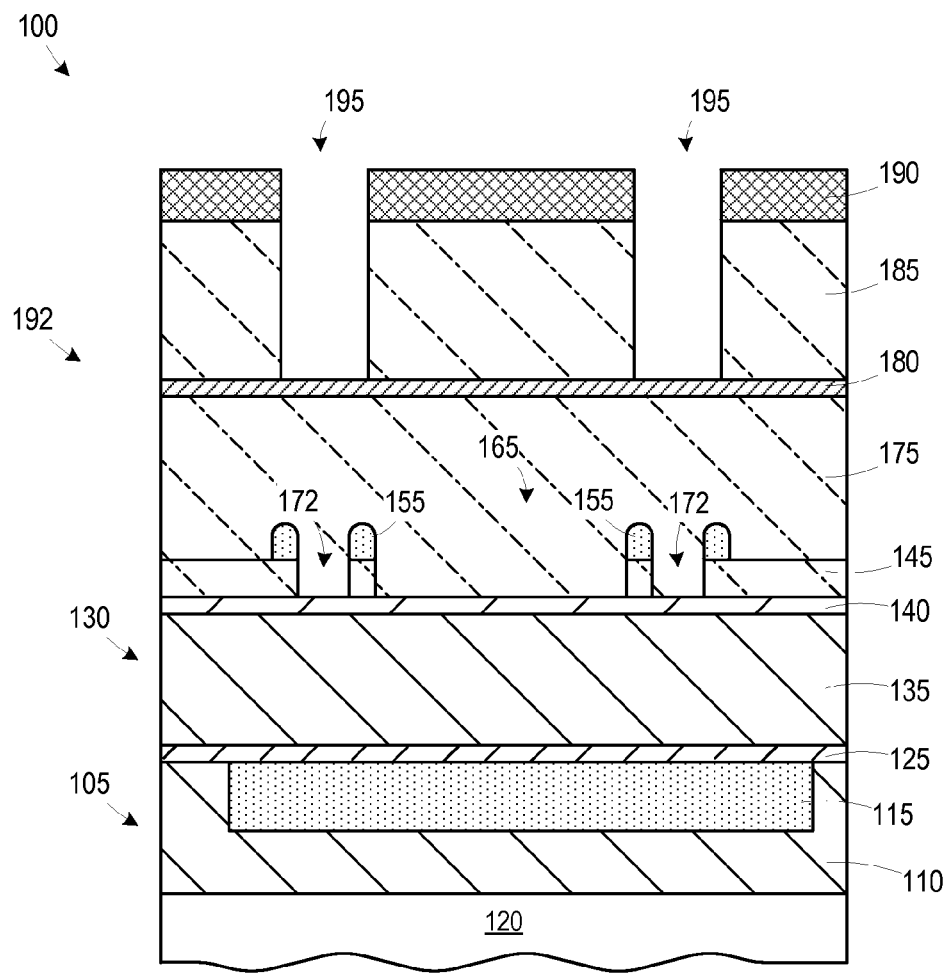
Figure 1I:
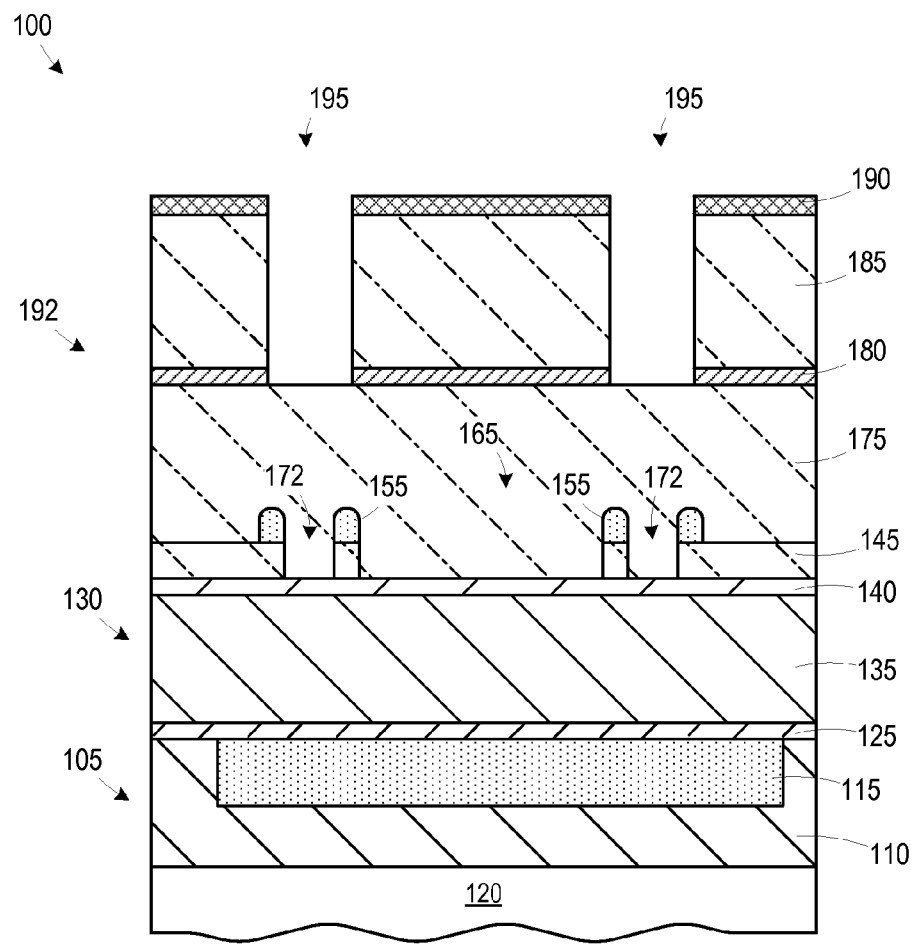
Figure 1J:
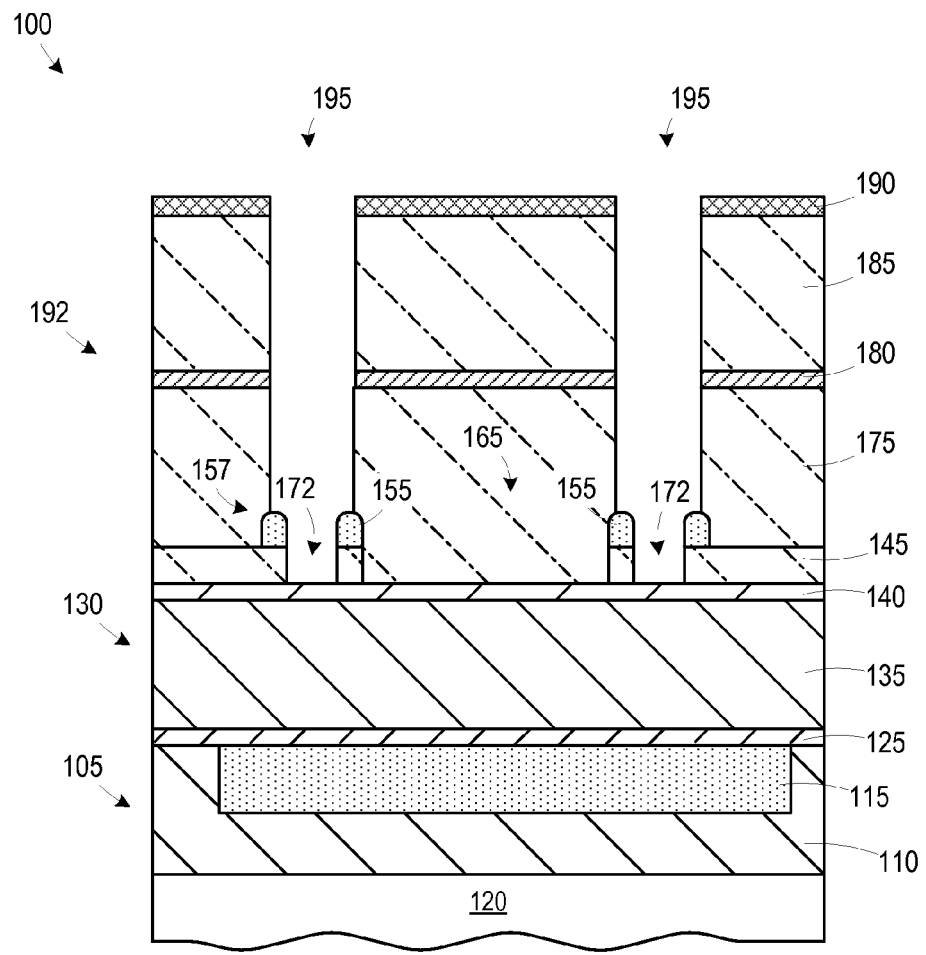
Figure 1K:
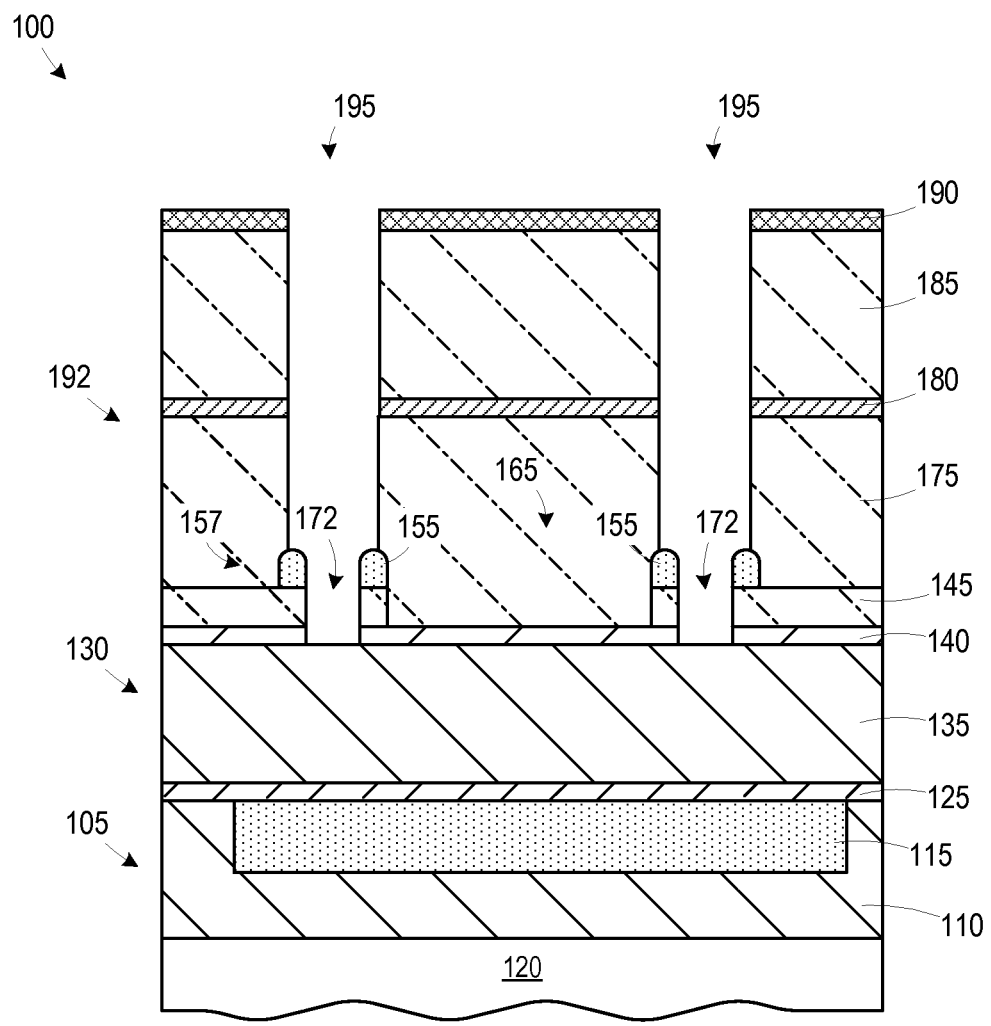
Figure 1L:
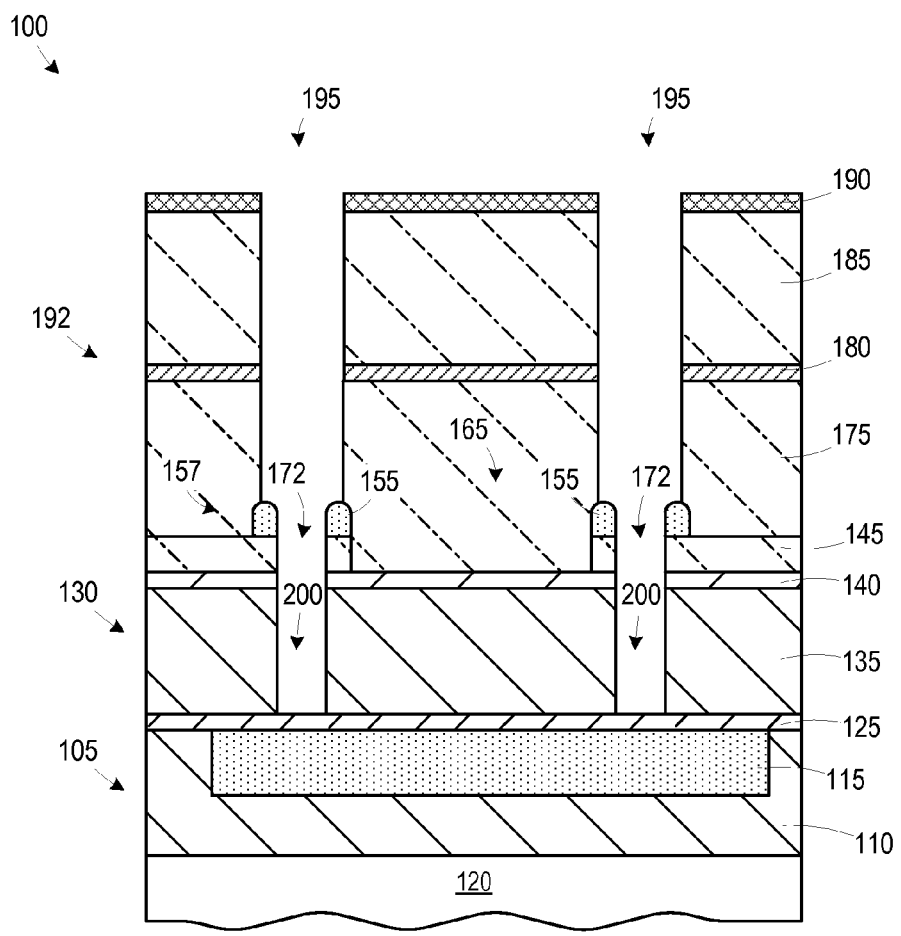
Figure 1M:
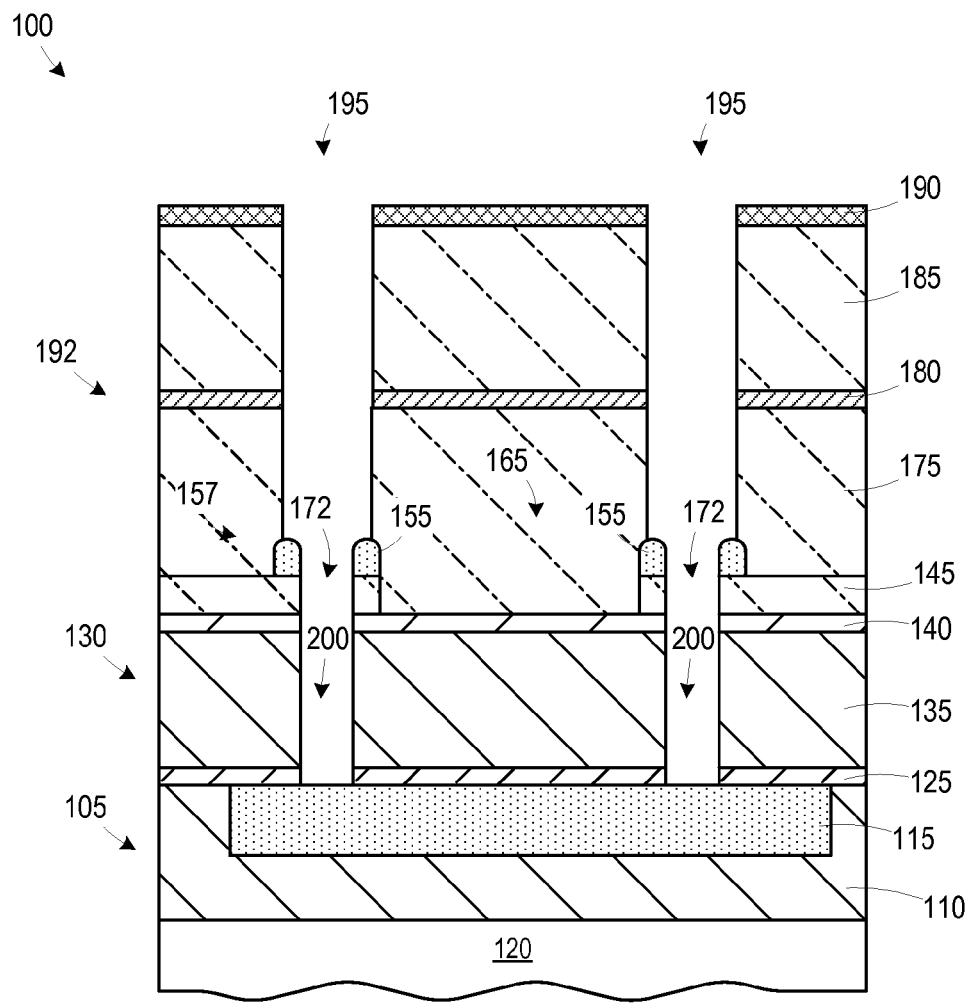
Figure 1N:
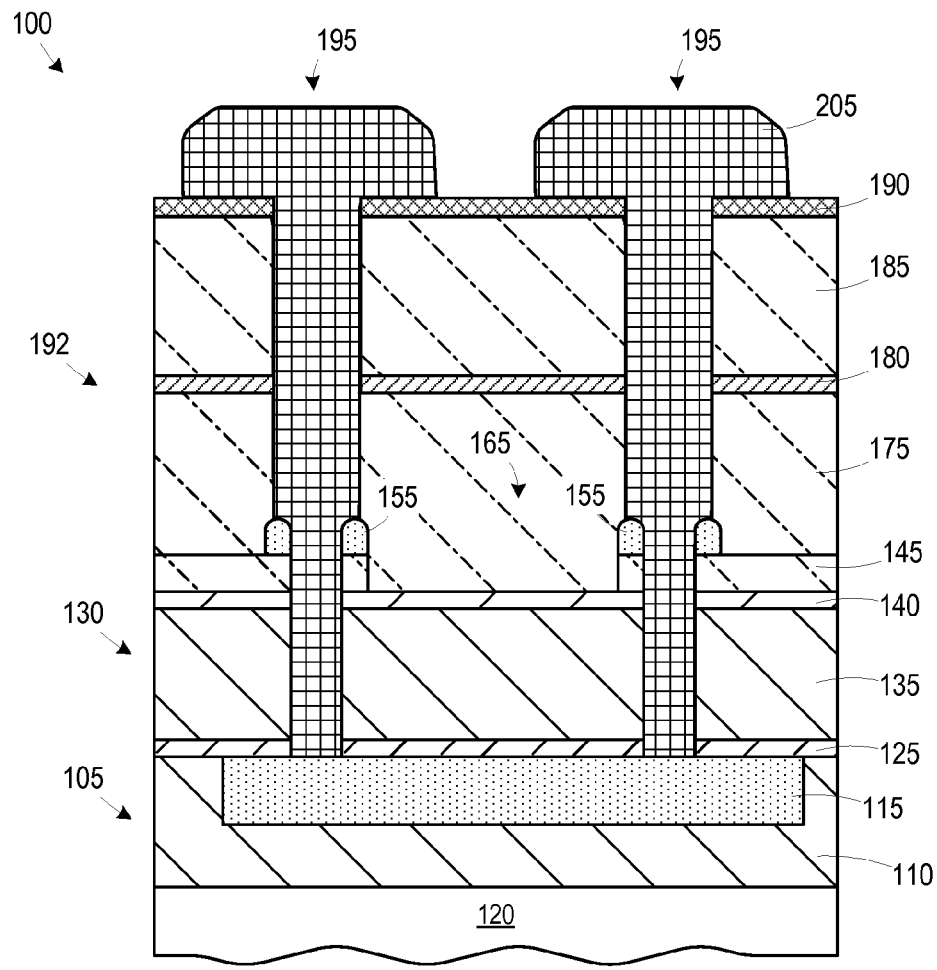
Figure 1O:
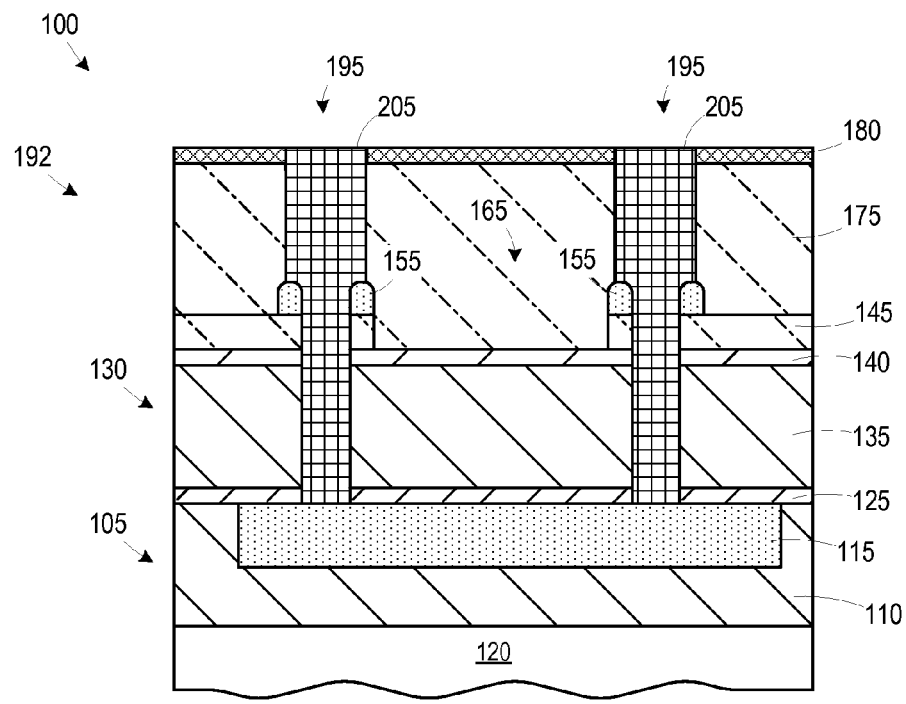
Figure 1P:
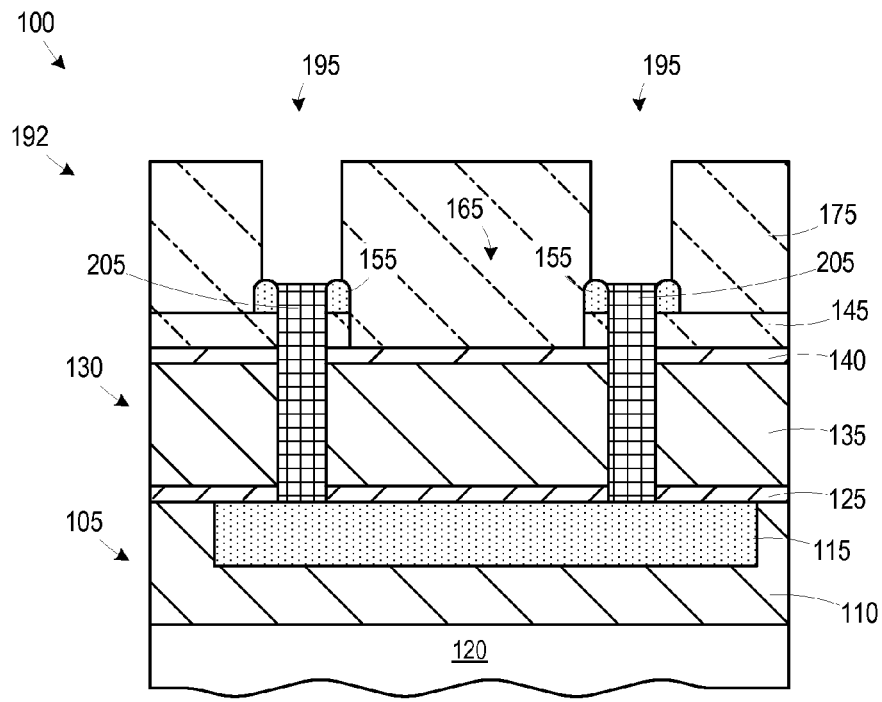
Figure 1Q:
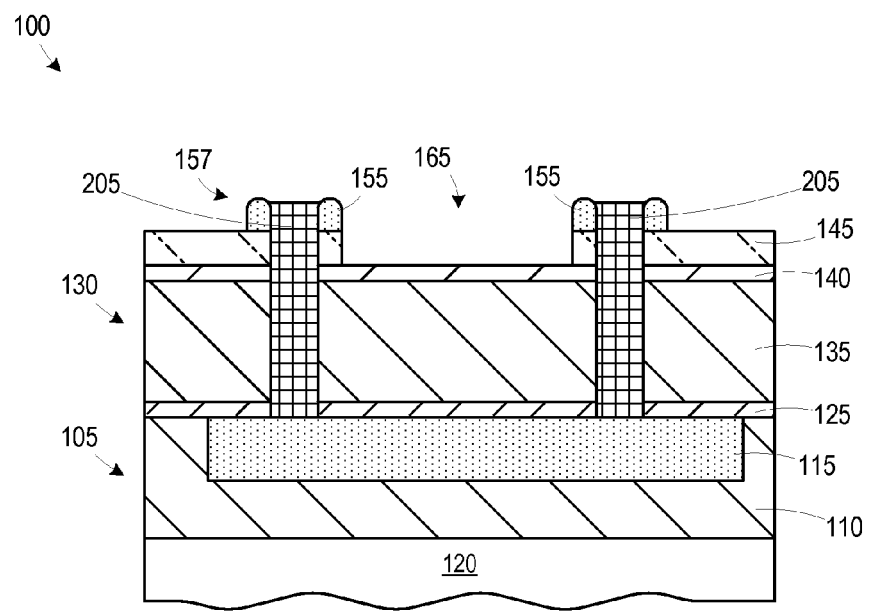
Figure 1R:
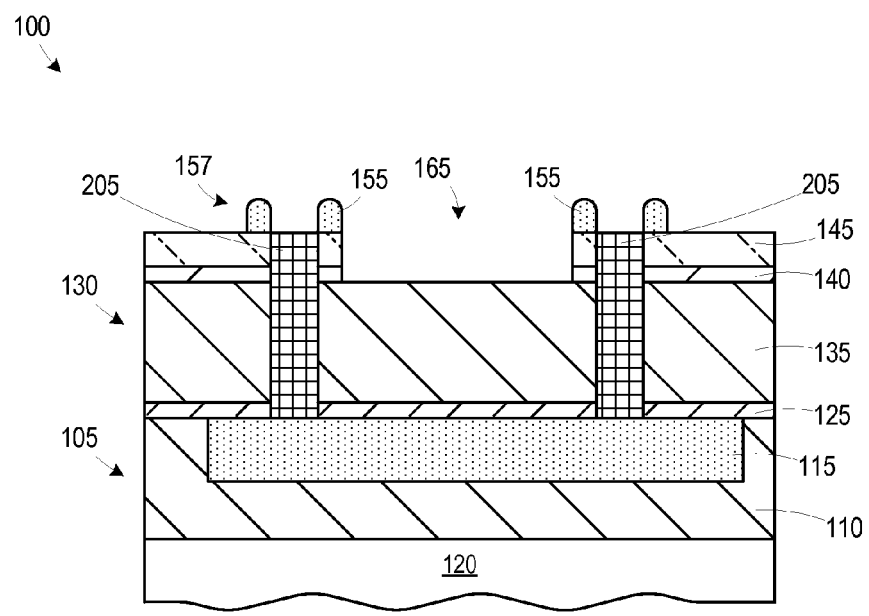
Figure 1S:
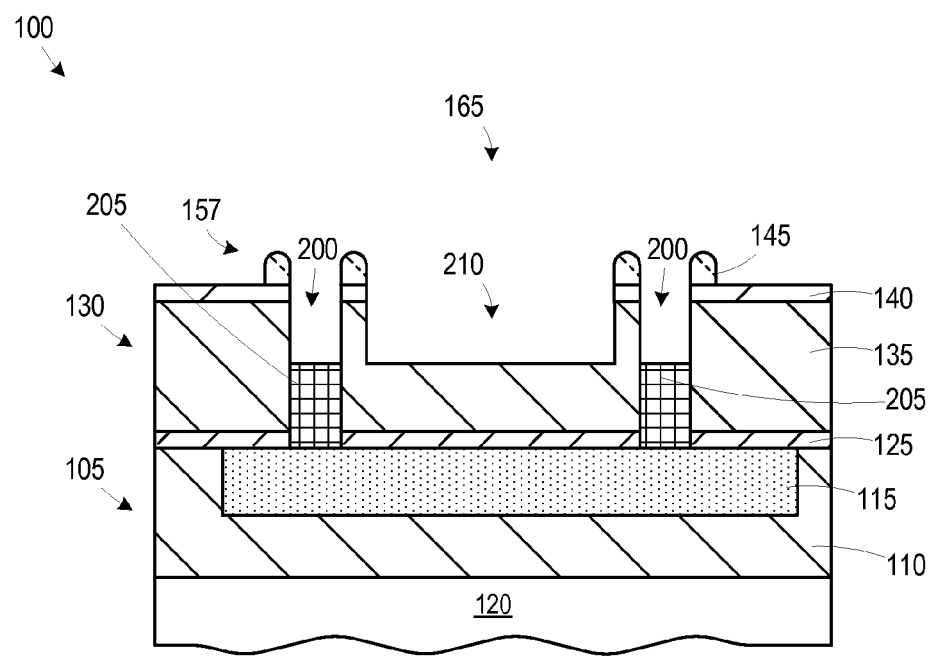
Figure 1T:
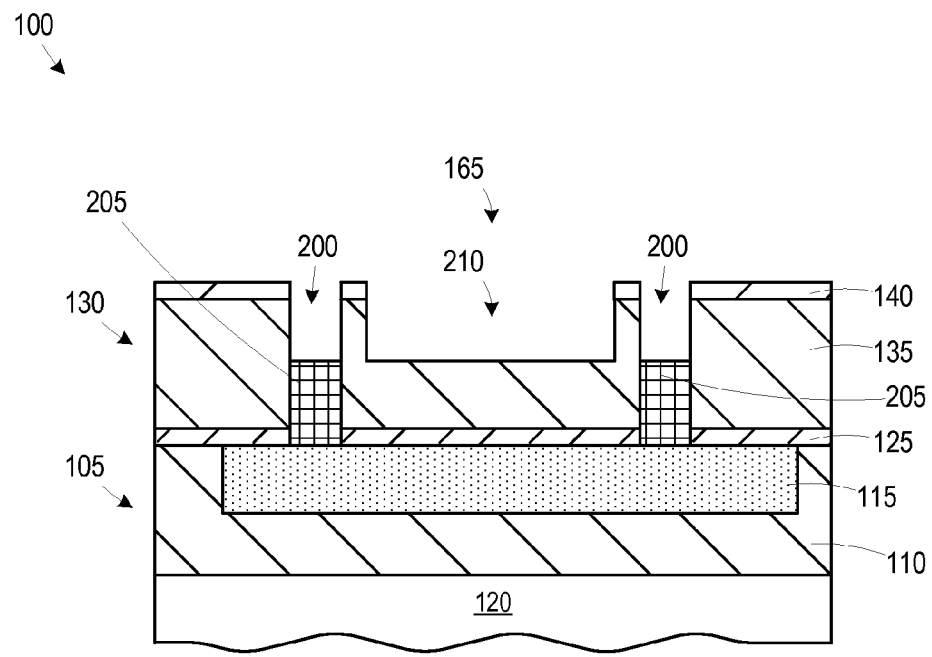
Figure 1U:
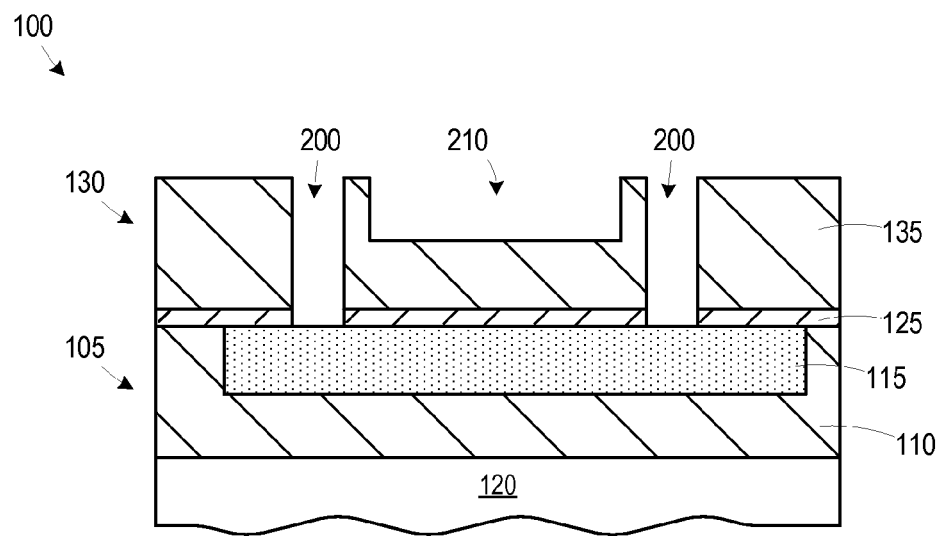
Figure 1V:
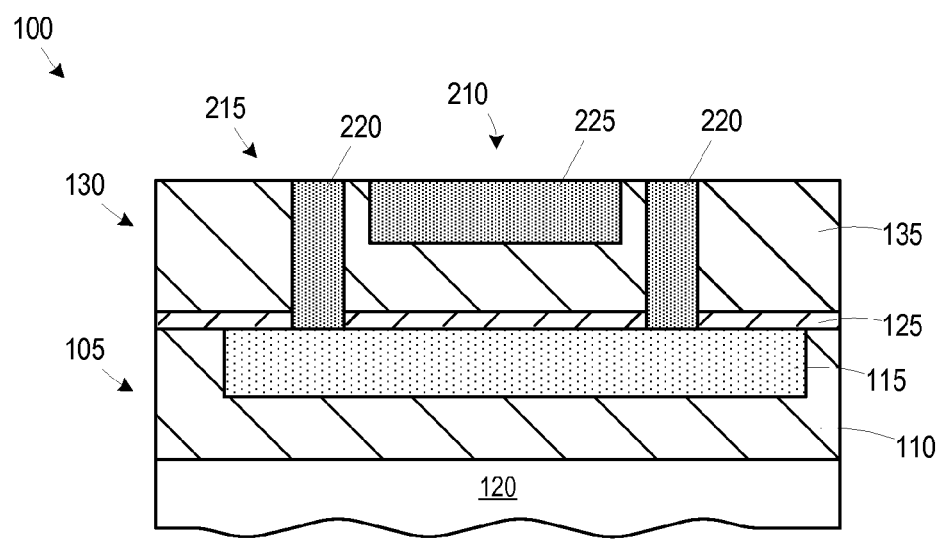

FIGS. 1A-1V are cross-sectional diagrams illustrating a method for forming interconnect features with reduced sidewall tapering as compared to prior art interconnect features in a semiconductor device 100, which, in the present embodiment, may be represented by an integrated circuit including circuit elements, such as transistors, capacitors, resistors and the like. FIG. 1A illustrates the device 100 including a first metallization layer 105 including a dielectric layer 110 and a conductive feature 115 (e.g., copper or tungsten metal line) embedded in the dielectric layer 110. The metallization layer 105 is formed in and above a substrate 120 in which semiconductor-based circuit elements may be provided. For convenience, such circuit elements are not shown in FIG. 1A. The metallization layer 105 includes a cap layer 125 (e.g., $SiC_xN_yH_z$) formed above the dielectric layer 110 and the conductive feature 115.

The substrate 120 may also include any appropriate microstructure features, such as micromechanical components, optoelectronic components and the like, wherein at least some of these components may require an interconnect structure formed in a metallization system. In highly complex integrated circuits, a very large number of electrical connections may be required and, thus, a plurality of metallization layers may typically be formed in the metallization system. The metallization layer 105 is sometimes referred to in the industry as the "M1" or "metal 1" layer.

As shown in FIG. 1A, a second metallization layer 130, defined by a second dielectric layer 135 and a second cap layer 140 (e.g., SiNH), was formed above the first metallization layer 105. The dielectric layers 110, 135 may be the same or different materials. In the illustrated embodiment, the dielectric layers 110, 135 may be a low-k dielectric material having a dielectric constant of approximately 3.0 or lower or an ultra-low-k (ULK) material having a dielectric constant of approximately 2.5 or lower.

FIG. 1B illustrates the device 100 after a plurality of deposition processes were performed to form a first hard mask layer 145 (e.g., TiN) and a template layer 150 (e.g., photoresist) above the cap layer 140.

FIG. 1C illustrates the device 100 after several process operations were performed. First, a deposition process was performed to form a layer of spacer material (silicon dioxide) above the template layer 150. Then, an anisotropic etch process was performed to define spacers 155 adjacent the template layer 150. Thereafter, the template layer 150 was removed (e.g., by an ashing process), leaving a spacer etch mask 157 including self-aligned via openings 160 and a self-aligned trench opening 165 defined by the spacers 155. The view of FIG. 1C is a view of the trench opening 165 across its width, as the length of the trench opening 165 runs into the page. In general, the spacers 155 define mask elements. The application of the present techniques is not limited to an etch mask with mask elements formed using sidewall spacers, as illustrated in FIG. 1C. Other types of etch masks may be used, such as a patterned photoresist mask or an etch mask patterned using a photolithography process.

FIG. 1D illustrates the device 100 after a patterned photoresist mask 170 was formed above the spacer etch mask 157 so as to thereby expose regions of the hard mask layer 145. Note that the edge of the opening in the patterned photoresist mask 170 is positioned on the outermost spacers 155. The patterned photoresist mask 170 may be formed using well-known photolithography tools and techniques.

FIG. 1E illustrates the device 100 after an anisotropic etch process was performed to pattern the exposed portions of the hard mask layer 145 using the spacer etch mask 157 to define self-aligned via openings 172 in the hard mask layer 145 and after an ashing process was performed to remove the photoresist layer 170.

FIG. 1F illustrates the device 100 after a plurality of deposition processes were performed to define a patterning stack above the hard mask layer 145 and the spacer etch mask 157. In one illustrative embodiment the patterning stack includes a first organic planarization layer (OPL) 175, an optional intermediate stop layer 180 (e.g., low temperature oxide (LTO)), a second OPL layer 185, and an anti-reflective coating (ARC) layer 190 (e.g., LTO). The ARC layer 190 was patterned (e.g., using a photoresist mask—not shown) to define via openings 195. As will be appreciated by those skilled in the art, the layers 175, 180, 185, 190 collectively constitute a multiple layer patterning layer 192. As described more fully below, several etching processes will be performed so as to form an opening 195 in at least the lowermost layer 175 of the multiple layer patterning layer 192 so as to expose or connect with the previously formed opening 160 in the spacer etch mask 157 and the opening 172 in the hard mask layer 145.

FIG. 1G illustrates the device 100 after an etch process (e.g., reactive ion etch) was performed to extend the via openings 195 partially through the second OPL layer 185.

FIG. 1H illustrates the device 100 after an etch process (e.g., ashing) was performed to further extend the via openings 195 and expose the stop layer 180. In some embodiments, the etch processes of FIGS. 1G and 1H may be combined into a single step.

FIG. 1I illustrates the device 100 after an etch process was performed to extend the via openings 195 through the stop layer 180. In some embodiments, the etching of the stop layer 180 may reduce the thickness of the ARC layer 190, as they may be formed of the same material.

FIG. 1J illustrates the device 100 after an etch process (e.g., ashing) was performed to extend the via openings 195 through the first OPL layer 175 and expose the cap layer 140 and adjacent portions of the spacers 155. Note the edges of the extended via openings 195 are positioned above the spacers 155 and the exposure of the cap layer 145 is governed by the previously formed via openings 172 in the hard mask layer 145.

FIG. 1K illustrates the device 100 after an etch process (e.g., reactive ion etch) was performed through the via openings 172 to open the cap layer 140 using the spacers 155 and the hard mask layer 145 to self-align the etch process and expose the dielectric layer 135.

FIG. 1L illustrates the device 100 after an etch process (e.g., reactive ion etch) was performed to define via openings 200 in the dielectric layer 135 using the spacers 155 and the hard mask layer 145 to self-align the etch process and expose the cap layer 125.

FIG. 1M illustrates the device 100 after an optional etch process (e.g., reactive ion etch) was performed to open the cap layer 125 and expose the underlying conductive feature 115. In some embodiments, the cap layer 125 may be opened at a later stage in the process flow.

FIG. 1N illustrates the device 100 after a deposition process was performed to form a sacrificial material 205 (e.g., a polymer) in the via openings 195, 200 to protect the surface of the conductive feature 115. In some embodiments, the OPL layers 175, 185, the stop layer 180, and the ARC layer 190 may be removed prior to forming the sacrificial material 205.

FIG. 1O illustrates the device 100 after one or more planarization processes were performed to remove the ARC layer 190 and the second OPL layer 185 selectively to the stop layer 180. Portions of the sacrificial layer 205 were also removed during the planarization process. In an embodiment where the stop layer 190 is not used, the planarization process may be timed to remove the upper portion of the OPL layer.

FIG. 1P illustrates the device 100 after a first etch process (e.g., reactive ion etch) was performed to remove the stop layer 180 and a second etch process (e.g., reactive ion etch) was performed to recess the sacrificial material 205. The second etch process is optional, as the sacrificial material 205 may be removed at a later stage in the process flow.

FIG. 1Q illustrates the device 100 after an etch process (e.g., reactive ion etch) was performed to remove the first OPL layer 175 selectively to the hard mask layer 145, the spacers 155, the layer 140 and the sacrificial material 205. In some embodiments, the etch process may not be selective to the sacrificial material 205 and portions thereof may be removed. For example, if the optional recess of the sacrificial material 205 was not performed as described above in reference to FIG. 1P, these portions would be removed concurrently with the removal of the first OPL layer 175.

FIG. 1R illustrates the device 100 after an etch process (e.g., reactive ion etch) was performed to open the cap layer 140 and remove portions of the sacrificial material 205. The opening of the cap layer 140 exposes the portions of the dielectric layer 135 below the self-aligned trench opening 165.

FIG. 1S illustrates the device 100 after an etch process (e.g., timed reactive ion etch) was performed to define a trench opening 210 in the dielectric layer 135. The view of FIG. 1S is a view of the trench opening 210 across its width, as the length of the trench opening 210 runs into the page. The trench etch also removes the spacer etch mask 157, portions of the mask layer 145 not covered by the spacers 155, and portions of the sacrificial material 205, but enough remains to protect the surface of the conductive feature 115 during the etch.

FIG. 1T illustrates the device 100 after an etch process (e.g., reactive ion etch) was performed to remove the remaining portions of the hard mask layer 145. The presence of the sacrificial material 205 allows a more aggressive etch process to be employed while protecting the conductive feature 115.

FIG. 1U illustrates the device 100 after a first etch process was performed to remove the cap layer 140 and a second etch process was performed to remove the remaining portions of the sacrificial material 205 and expose the conductive feature 115. In some embodiments, the cap layer 140 and the sacrificial material 205 may be removed in a concurrent etch process. In other embodiments, the etch process for removing the cap layer 140 may be combined with the previous etch process to remove the hard mask layer 145.

FIG. 1V illustrates the device 100 after a deposition process (e.g., plating) has been performed to form a conductive material 215 in the via openings 200 and the trench opening 210, thereby forming conductive vias 220 and a conductive line 225, and after a planarization process was performed to remove excess portions of the conductive material 215 extending above the dielectric layer 135. The conductive material 215 may include multiple layers (not shown), such as one or more barrier layers (e.g., Ta, TaN, TiN, etc.) to prevent migration of any metal in the conductive vias 220 or line 225 into the dielectric layer 135, a metal seed layer (e.g., copper), a metal fill material (e.g., copper), a metal silicide material, etc.

The use of the spacers 155 to define the self-aligned via openings 160 and the self-aligned trench opening 165 in the hard mask layer 145 reduces tapering in the subsequently formed via openings 200 and trench opening 210 in the dielectric layer 135. In general, sidewall angles>85 degrees may be provided. The reduced tapering allows interconnect feature density to be increased and the spacers 155 also reduce the likelihood of defects arising from short circuits between the conductive line 225 formed in the trench opening 210 and the conductive vias 220 formed in the via openings 200.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a stack of materials comprising a first dielectric layer having a conductive feature positioned therein, and a second dielectric layer positioned above said first dielectric layer;
    forming an etch mask comprising a plurality of spaced apart mask elements above said second dielectric layer, said mask elements defining at least a first via opening exposing said second dielectric layer;
    forming a patterning layer above said etch mask;
    forming a second via opening in said patterning layer to expose said first via opening in said etch mask;
    etching said second dielectric layer through said second via opening to define a third via opening in said second dielectric layer exposing said conductive feature;
    removing said patterning layer and said etch mask; and
    forming a conductive via in said third via opening, said conductive via contacting said conductive feature.

2. The method of claim 1, further comprising:
forming a hard mask layer positioned above said second dielectric layer prior to forming said etch mask, wherein said first via opening exposes a first portion of said hard mask layer;
forming said plurality of spaced apart mask elements to define a first trench opening exposing a second portion of said hard mask layer;
etching said hard mask layer using said etch mask to define a fourth via opening and a second trench opening in said hard mask layer;
forming a sacrificial material in at least said third via opening after etching said second dielectric layer;
removing said patterning layer to expose said second trench opening;
etching said second dielectric layer through said second trench opening to define a trench recess in said second dielectric layer, wherein said sacrificial material at least partially fills said third via opening after said etching;
removing said hard mask layer; and
forming a conductive line in said trench recess.

3. The method of claim 2, further comprising removing said sacrificial material from said third via opening after defining said trench recess.

4. The method of claim 2, wherein forming said conductive via and said conductive line comprises:
forming a conductive material above said second dielectric layer and to fill said third via opening and said trench recess; and
removing portions of said conductive material disposed above said second dielectric layer.

5. The method of claim 2, further comprising removing said patterning layer prior to forming said sacrificial material.

6. The method of claim 1, further comprising:
forming a hard mask layer positioned above said second dielectric layer prior to forming said etch mask, wherein said first via opening exposes a first portion of said hard mask layer;
etching said hard mask layer using said etch mask to define a fourth via opening in said hard mask layer;
forming a cap layer between said second dielectric layer and said hard mask layer; and
etching said cap layer through said fourth via opening to expose said second dielectric layer.

7. The method of claim 1, further comprising:
forming a hard mask layer positioned above said second dielectric layer prior to forming said etch mask, wherein said first via opening exposes a first portion of said hard mask layer;
forming said plurality of spaced apart mask elements to define a first trench opening exposing a second portion of said hard mask layer;
etching said hard mask layer using said etch mask to define a fourth via opening and a second trench opening in said hard mask layer;
forming a sacrificial material in at least said third via opening after etching said second dielectric layer; and
removing a first portion of said patterning layer and said sacrificial layer using a planarization process.

8. The method of claim 7, wherein said patterning layer comprises a first planarization layer, a stop layer formed above said first planarization layer, and a second planarization layer formed above said stop layer, and removing said first portion of said patterning layer and said sacrificial layer comprises removing said second planarization layer and terminating said planarization process on said stop layer.

9. The method of claim 8, further comprising:
removing said stop layer; and
removing said first planarization layer to expose said second trench opening.

10. The method of claim 9, further comprising recessing said sacrificial material prior to removing said first planarization layer.

11. The method of claim 7, further comprising:
forming a cap layer between said second dielectric layer and said hard mask layer;
etching said cap layer through said fourth via opening to expose a first portion of said first dielectric layer; and
etching said cap layer through said second trench opening to expose a second portion of said second dielectric layer.

12. The method of claim 11, further comprising removing said etch mask and etching said cap layer using a concurrent etching process.

13. The method of claim 2, further comprising removing said hard mask layer in the presence of said sacrificial material in said third via opening.

14. A method, comprising:
forming a stack of materials comprising a first dielectric layer having a conductive feature positioned therein, a second dielectric layer positioned above said first dielectric layer, and a hard mask layer positioned above said second dielectric layer;
forming an etch mask comprising a plurality of spaced apart mask elements above said hard mask layer, said mask elements defining at least a first via opening exposing a first portion of said hard mask layer and a first trench opening exposing a second portion of said hard mask layer;
etching said hard mask layer using said etch mask to define a second via opening and a second trench opening in said hard mask layer;
forming a patterning layer above said hard mask layer and said mask elements;
forming a third via opening in said patterning layer to expose said second via opening in said hard mask layer;
etching said second dielectric layer through said second via opening to define a fourth via opening in said second dielectric layer exposing said conductive feature;
forming a sacrificial material in at least said fourth via opening;
removing said patterning layer to expose said second trench opening;
etching said second dielectric layer through said second trench opening to define a trench recess in said second dielectric layer, wherein said sacrificial material at least partially fills said fourth via opening during said etching of said second dielectric layer through said second trench opening;
removing said mask elements, said hard mask layer, and said sacrificial material; and
forming a conductive via in said fourth via opening and a conductive line in said trench recess, said conductive via contacting said conductive feature.

15. The method of claim 14, wherein forming said conductive via and said conductive line comprises:
forming a conductive material above said second dielectric layer and to fill said fourth via opening and said trench recess; and
removing portions of said conductive material disposed above said second dielectric layer.

16. The method of claim 14, further comprising removing said patterning layer prior to forming said sacrificial material.

17. The method of claim 14, further comprising removing a first portion of said patterning layer and said sacrificial layer using a planarization process.

18. The method of claim 17, wherein said patterning layer comprises a first planarization layer, a stop layer formed above said first planarization layer, and a second planarization layer formed above said stop layer, and removing said first portion of said patterning layer and said sacrificial layer comprises removing said second planarization layer and terminating said planarization process on said stop layer.

19. The method of claim 18, further comprising:
    removing said stop layer; and
    removing said first planarization layer to expose said second trench opening.

20. The method of claim 19, further comprising recessing said sacrificial material prior to removing said first planarization layer.

\* \* \* \* \*